(12) United States Patent
Choi et al.

(10) Patent No.: US 10,103,313 B2
(45) Date of Patent: Oct. 16, 2018

(54) BUTTON DEVICE USING PIEZOELECTRIC ELEMENT

(71) Applicant: WISOL CO., LTD., Gyeonggi-do (KR)

(72) Inventors: Yo Sep Choi, Gyeonggi-do (KR); Jae Hyung Choi, Gyeonggi-do (KR); Bong Soo Kim, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 396 days.

(21) Appl. No.: 15/179,205

(22) Filed: Jun. 10, 2016

(65) Prior Publication Data

US 2017/0033275 A1    Feb. 2, 2017

(30) Foreign Application Priority Data

Jul. 30, 2015   (KR) ........................ 10-2015-0107915

(51) Int. Cl.
*H01L 41/09*    (2006.01)
*H01L 41/113*    (2006.01)
*H01L 41/053*    (2006.01)
*B06B 1/06*    (2006.01)
(Continued)

(52) U.S. Cl.
CPC ........ *H01L 41/1138* (2013.01); *B06B 1/0603* (2013.01); *H01L 41/0471* (2013.01); *H01L 41/0474* (2013.01); *H01L 41/0475* (2013.01); *H01L 41/053* (2013.01); *H01L 41/0833* (2013.01); *H01L 41/0973* (2013.01); *H01L 41/1132* (2013.01)

(58) Field of Classification Search
CPC ............. H01L 41/1138; H01L 41/0471; H01L 41/0474; H01L 41/0475; H01L 41/053; H01L 41/0833; H01L 41/0973; H01L 41/1132; B06B 1/0603
USPC .......................... 310/324, 328, 330–332, 348
See application file for complete search history.

(56) References Cited

U.S. PATENT DOCUMENTS 6,064,141 A * 5/2000 Wiciel ................. H03K 17/964
                                                        310/324
2010/0141580 A1* 6/2010 Oh ........................ G06F 3/0202
                                                        345/158
(Continued)

FOREIGN PATENT DOCUMENTS

JP    2014-194691    10/2014
JP    2014-229404    12/2014
KR    10-1994-0001964    2/1994

*Primary Examiner* — Thomas Dougherty
(74) *Attorney, Agent, or Firm* — Harness, Dickey & Pierce, P.L.C.

(57) ABSTRACT

A button device includes a piezoelectric element which includes a piezoelectric body with one surface on which a first external electrode and a second external electrode are formed and a plate with one surface attached to the other surface of the piezoelectric body, a supporting plate disposed on the one surface of the piezoelectric body, a cover disposed on the other surface of the plate, a first spacer provided between an edge portion of the one surface of the plate and the supporting plate, a second spacer provided between at least a part of an edge portion of the other surface of the plate and the cover to provide a separation space between the plate and the cover, and a dot provided in the separation space to transfer an external force to the piezoelectric element or to transfer a vibration of the piezoelectric element to the cover.

9 Claims, 4 Drawing Sheets

(51) Int. Cl.
*H01L 41/047* (2006.01)
*H01L 41/083* (2006.01)

(56) References Cited

U.S. PATENT DOCUMENTS

2012/0275086 A1* 11/2012 Pasquero .............. G06F 1/1626
                                                    361/679.01
2017/0309141 A1* 10/2017 Fruchard .................. F21K 9/68

* cited by examiner

BUTTON DEVICE USING PIEZOELECTRIC ELEMENT

CROSS-REFERENCE TO RELATED APPLICATION

This application claims the benefit of Korean Patent Application No. 2015-0107915, filed on Jul. 30, 2015 in the Korean Intellectual Property Office, the disclosure of which is incorporated herein by reference.

FIELD

The present invention relates to a button device, and more particularly, to a button device using a piezoelectric element.

BACKGROUND

Recently, as user interfaces of cellular phones, games, home appliances, etc., buttons of elevators, or switches in buildings, buttons using piezoelectric elements have been in the spotlight.

Piezoelectric elements mean elements using a piezoelectric effect, in which electric polarizability occurs and a potential difference is created when an external force or touch is applied, but on the other hand, deformation or stress is created when a voltage is applied.

Buttons using piezoelectric elements not only may sense an external force and generate an electric signal to function as input units and but also may apply an electric signal to a piezoelectric element to generate a vibration to provide feedback to a user.

Despite such advantages described above, since not easy to manufacture thin buttons using piezoelectric elements, buttons using piezoelectric elements are not generally utilized. Also, buttons using piezoelectric elements need a structure of effectively transferring a vibration of a piezoelectric element to users.

SUMMARY

Therefore, it is an aspect of the present invention to provide a button device using a piezoelectric element, which is easily manufactured as a thin type appropriate for being used for a portable product such as a cellular phone and capable of effectively transferring a vibration of the piezoelectric element to a user.

Additional aspects of the invention will be set forth in part in the description which follows and, in part, will be obvious from the description, or may be learned by practice of the invention.

In accordance with one aspect of the present disclosure, a button device using a piezoelectric element includes the piezoelectric element which includes a piezoelectric body with one surface on which a first external electrode and a second external electrode are formed and a plate with one surface attached to the other surface of the piezoelectric body, a supporting plate disposed on the one surface of the piezoelectric body, a cover disposed on the other surface of the plate, a first spacer provided between an edge portion of the one surface of the plate and the supporting plate to provide a space in which the piezoelectric element is deformable due to an external force applied to the cover, a second spacer provided between at least a part of an edge portion of the other surface of the plate and the cover to provide a separation space between the plate and the cover, and a dot provided in the separation space to transfer the external force to the piezoelectric element or to transfer a vibration of the piezoelectric element to the cover.

The button device may further include an adhesive between the plate and the second spacer and an adhesive between the second spacer and the cover.

The second spacer may be a double-sided adhesive tape.

The separation space may be empty.

The separation space may be filled with a soft material.

The second spacer may be formed along the edge portion.

A plurality of such second spacers may be formed at a plurality of places of the edge portion while being spaced apart.

The piezoelectric body may be a stack type piezoelectric body.

A ratio of a length of the piezoelectric body to a length of the plate may be 55% or more.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1A:
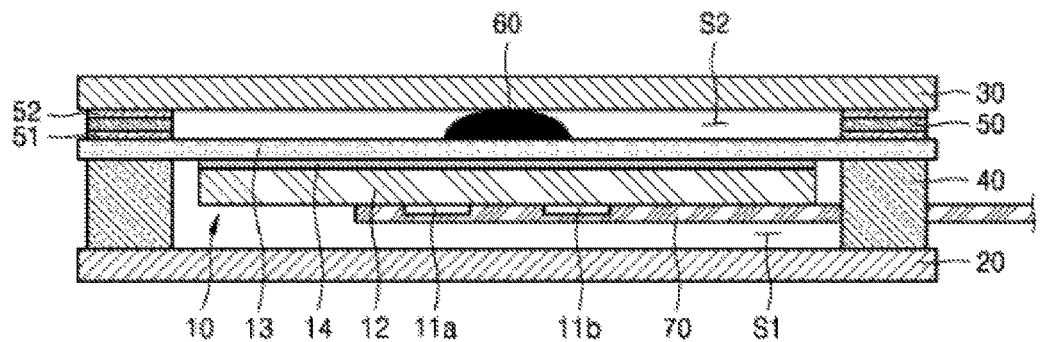
FIG. 1A is a side view of a button device using a piezoelectric element in accordance with one embodiment of the present invention.

Hereinafter, exemplary embodiments of the present invention will be described in detail with reference to the drawings. Hereinafter, throughout the following description and attached drawings, like reference numerals designate like elements and a repetitive description thereof will be omitted. While describing the present invention, when it is determined that a detailed description of well-known functions or components may obscure the points of the present invention, the detailed description will be omitted.

Figure 1B:
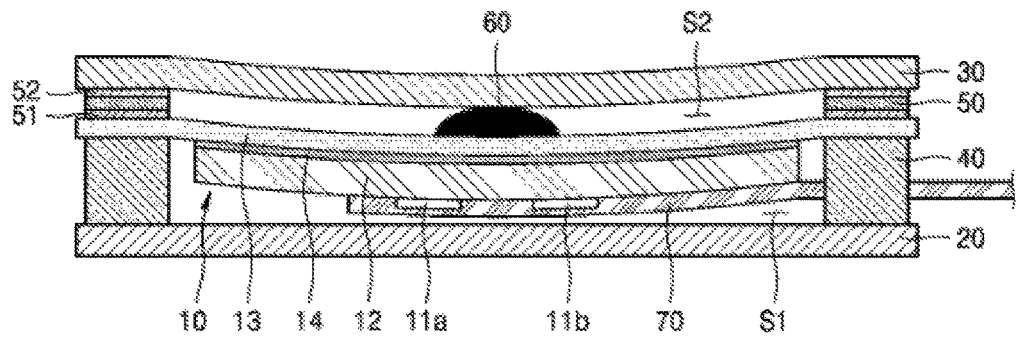
FIG. 1B is a view illustrating an example of the piezoelectric element deformed when an external force is applied to the button device of FIG. 1A.

FIG. 1A is a side view of a button device using a piezoelectric element 10 in accordance with one embodiment of the present invention. FIG. 1B is a view illustrating an example of the piezoelectric element 10 deformed when an external force or touch F is applied to the button device of FIG. 1A.

The button device in accordance with one embodiment of the present invention includes the piezoelectric element 10, a supporting plate 20, a cover 30, a first spacer 40, a second spacer 50, and a dot 60.

The supporting plate 20 supports the first spacer 40, the piezoelectric element 10, the second spacer 50, and the cover 30, disposed thereon. The supporting plate 20 may be manufactured using, for example, tempered glass, epoxy, etc.

The piezoelectric element 10 includes a piezoelectric body 12 and a plate 13. The piezoelectric body 12 includes a first external electrode 11a and a second external electrode 11b formed on one surface (a bottom surface in FIG. 1B). The piezoelectric body 12 is attached to one surface of the plate 13. The piezoelectric body 12 and the plate 13 may be attached by an adhesive 14.

The piezoelectric body 12 may be manufactured using a material with excellent piezoelectric properties such as crystal, tourmaline, lead zirconium titanate (PZT), Rochelle salt, barium titanate, monoammonium phosphate, ethylenediamine tartrate, etc. The piezoelectric body 12 may be a stack type piezoelectric body with the one surface on which the first external electrode 11a and the second external electrode 11b are formed. A detailed example of the piezoelectric body 12 will be described below with reference to FIG. 2.

The plate 13 is a general metal material, and for example, may be a stainless material and has a larger area than the piezoelectric body 12. A ratio of a length of the piezoelectric body 12 to a length of the plate 13 may be 55% or more. For example, when a diameter of the plate 13 is 10 mm, a diameter of the piezoelectric body 12 may be from about 5.5 mm to about 10 mm.

The supporting plate 20 is disposed on the one surface (the bottom surface in FIG. 1) of the piezoelectric body 12. The first spacer 40 is provided between an edge portion of the one surface of the plate 13, that is, an edge outside an area to which the piezoelectric body 12 is attached and the supporting plate 20. To provide a space S1 in which the piezoelectric element 10 is deformable, the first spacer 40 has a thickness greater than that of the piezoelectric body 12, and more particularly, a thickness greater than a stack of the piezoelectric body 12 and a flexible circuit board 70 which will be described below.

The plate 13 and the first spacer 40 may be attached by an adhesive, and the first spacer 40 and the supporting plate 20 may also be attached by an adhesive. Depending on embodiments, the supporting plate 20 and the first spacer 40 may be integrally formed.

When shapes of the piezoelectric body 12 and the plate 13 are, for example, circles, the first spacer 40 may be embodied to allow the space S1 to have a circular shape. The shapes of the piezoelectric body 12 and the plate 13 may be other shapes in addition to circles, for example, triangles or quadrangles. In this case, the first spacer 40 may be embodied to allow the space S1 to also have a triangular shape or a quadrangular shape.

The cover 30 is disposed on the other surface (a top surface in FIG. 1) of the plate 13.

The second spacer 50 is provided between at least a part of an edge portion of the other surface of the plate 13 and the cover 30, thereby forming a separation space S2 between the plate 13 and the cover 30. The plate 13 and the second spacer 50 may be attached by an adhesive 51, and the second spacer 50 and the cover 30 may also be attached by an adhesive 52. Depending on embodiments, the second spacer 50 may be embodied as a double-sided adhesive tape with a predetermined thickness and one surface of the double-sided adhesive tape may be attached to the plate 13 and the other surface thereof may be attached to the cover 30. When the second spacer 50 is embodied as the double-sided adhesive tape, the adhesives 51 and 52 shown in FIG. 1 may be omitted.

The dot 60 is provided at a portion corresponding to a certain area based on a center of the piezoelectric element 10 in the separation space S2. The dot 60 may be formed of a hardened material. Although not shown in the drawings, the plate 13 and the dot 60 and the dot 60 and the cover 30 may be mutually attached by adhesives.

The dot 60 may transfer an external force applied to the cover 30 to the piezoelectric element 10 while transferring a vibration of the piezoelectric element 10 which receives an electric signal and then vibrates, to the cover 30.

When the external force F is applied by a finger and the like to the cover 30, as shown in FIG. 1B, the piezoelectric element 10 deforms in the space S1. Accordingly, voltages detected at the first and second external electrodes 11a and 11b are measured, thereby detecting the external force or touch F.

On the contrary, when electric signals are applied to the first and second external electrodes 11a and 11b of the piezoelectric element 10 and a vibration of the piezoelectric element 10 occurs, for example, the user who touches the cover 30 with a finger may receive feedback by feeling the vibration.

The vibration of the piezoelectric element 10 may deform the piezoelectric element 10 not only to be convex downward, that is, toward the supporting plate 20 but also to be convex upward, that is, toward the cover 30 in FIG. 1B. Due to the space S1 provided by the first spacer 40, the piezoelectric element 10 may be deformed to be convex downward. In addition, the separation space S2 provided by the second spacer 50 may allow the piezoelectric element 10 to be more easily convex upward. When a top surface of the plate 13 and the cover 30 are entirely attached without the second spacer 50, the piezoelectric element 10 may be interrupted by the cover 30 in being deformed to be convex upward.

As described above, in the embodiment of the present invention, the second spacer 50 provides the separation space S2 to allow the vibration of the piezoelectric element 10 to be smoothly performed, thereby effectively transferring the vibration of the piezoelectric element 10 to the user.

The separation space S2 may be empty. However, depending on embodiments, the separation space S2 may be filled with a soft material, for example, silicone. When the separation space S2 is filled with the soft material, the piezoelectric element 10 may not be fully interrupted in being deformed to be convex upward.

Also, the button device in accordance with one embodiment of the present invention may include the flexible circuit board 70 which includes conducting wire patterns (not shown) connected to the first and second external electrodes 11a and 11b to measure voltages detected at the first and second external electrodes 11a and 11b or to apply electric signals to the first and second external electrodes 11a and 11b.

The flexible circuit board 70 may measure the voltages detected at the first and second external electrodes 11a and 11b or may be connected to a circuit device (not shown) which applies electric signals to the first and second external electrodes 11a and 11b.

Depending on embodiments, wires may be connected to the first and second external electrodes 11a and 11b instead of the flexible circuit board 70 and voltages detected at the first and second external electrodes 11a and 11b may be measured.

Figure 2:
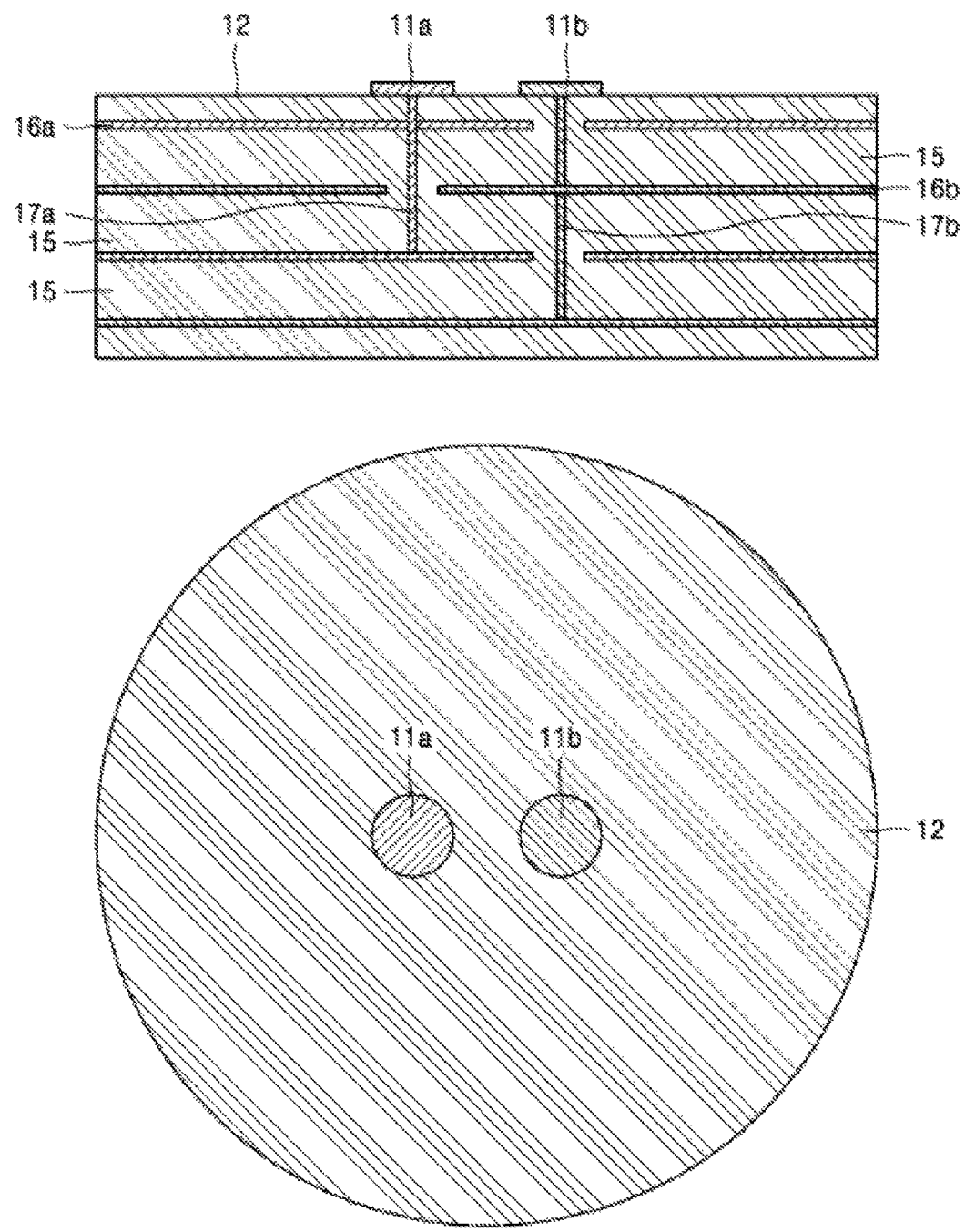
FIG. 2 illustrates a side view and a top view of a stack type piezoelectric body in accordance with one embodiment of the present invention.

FIG. 2 illustrates a side view and a top view of the stack type piezoelectric body 12 in accordance with one embodiment of the present invention.

The stack type piezoelectric body 12 in accordance with the embodiment includes the first and second external electrodes 11a and 11b are formed on one surface thereof, a plurality of piezoelectric layers 15 are stacked therein, and first and second internal electrodes 16a and 16b which alternate with each other to have mutually different polarities in a stacked direction and are disposed between the piezoelectric layers 15. The first and second external electrodes 11a and 11b and the first and second internal electrodes 16a and 16b are electrically connected using first and second conductive vias 17a and 17b, respectively.

Figure 3:
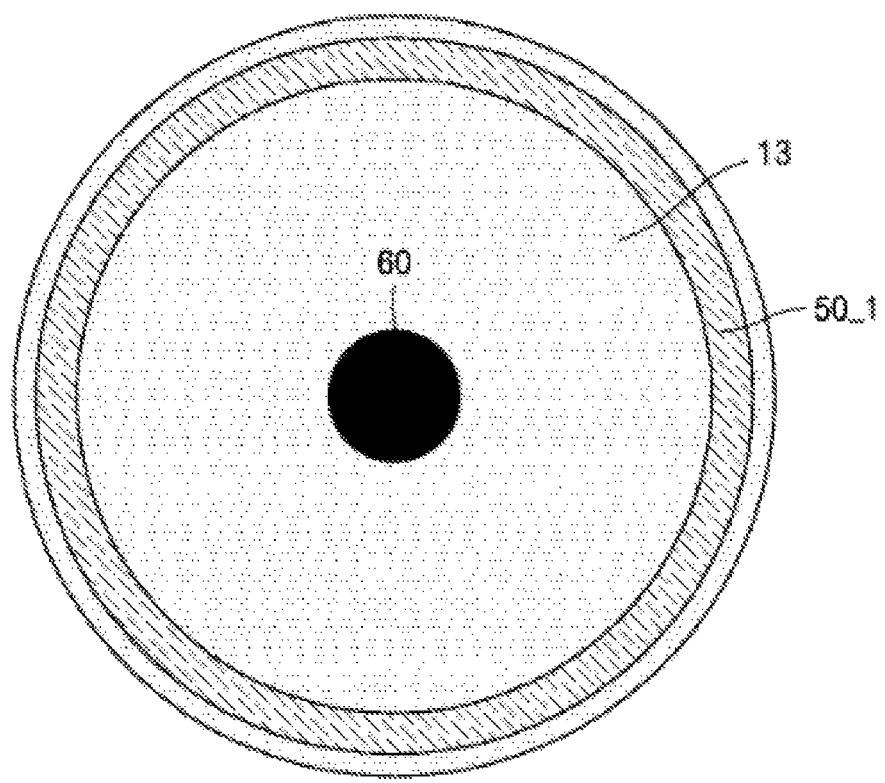
FIG. 3 is a top view of a second spacer in accordance with one embodiment of the present invention, in which a plate, the second spacer, and a dot are shown.

FIG. 3 is a top view of a second spacer 50_1 in accordance with one embodiment of the present invention, in which the plate 13, the second spacer 50_1, and the dot 60 are shown.

Referring to FIG. 3, the second spacer 50_1 in accordance with the present embodiment may be formed along an edge portion of a surface of the plate 13. FIG. 3 illustrates the circular plate 13 as an example. Accordingly, the second spacer 50_1 may have an annular shape. When the shape of the plate 13 is, for example, a triangle or a quadrangle in addition to the circle, the spacer 50_1 may be a triangular ring shape or a quadrangular ring shape.

Figure 4:
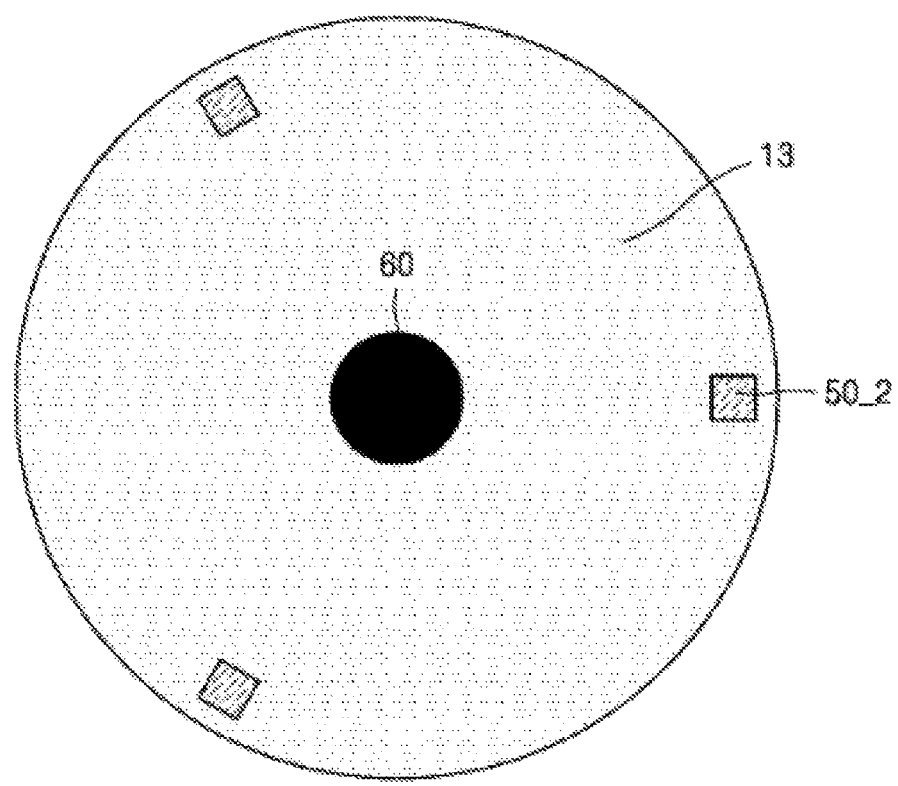
FIG. 4 is a top view of a second spacer in accordance with another embodiment of the present invention, in which the plate, the second spacer, and the dot are shown.

FIG. 4 is a top view of a second spacer 50_2 in accordance with another embodiment of the present invention, in which the plate 13, the second spacer 50_2, and the dot 60 are shown.

Referring to FIG. 4, the second spacer 50_2 in accordance with the present embodiment may be formed at a plurality of places of the edge portion of the surface of the plate 13. For example, as shown in the drawing, the second spacers 50_2 may be formed at three places of the edge portion of the surface of the plate 13 while being spaced apart. The second spacers 50_2 formed while being spaced apart may be formed three or more at the same intervals along an edge, and for example, may be formed four, five, etc. In FIG. 4, the respective second spacers 50_2 have quadrangular shapes as an example. However, the respective second spacers 50_2 may have various shapes such as triangles, circles, fan shapes, etc.

As is apparent from the above description, a button device using a piezoelectric element in accordance with one embodiment of the present invention is easily manufactured as a thin type appropriate for being used for a portable product such as a cellular phone and capable of effectively transferring a vibration of the piezoelectric element to a user.

Although a few embodiments of the present disclosure have been shown and described, it would be appreciated by those skilled in the art that changes may be made in these embodiments without departing from the principles and spirit of the invention, the scope of which is defined in the claims and their equivalents.

What is claimed is:

1. A button device using a piezoelectric element, comprising:
    the piezoelectric element which comprises a piezoelectric body with one surface on which a first external electrode and a second external electrode are formed and a plate with one surface attached to the other surface of the piezoelectric body;
    a supporting plate disposed on the one surface of the piezoelectric body;
    a cover disposed on the other surface of the plate;
    a first spacer provided between an edge portion of the one surface of the plate and the supporting plate to provide a space in which the piezoelectric element is deformable due to an external force applied to the cover;
    a second spacer provided between at least a part of an edge portion of the other surface of the plate and the cover to provide a separation space between the plate and the cover; and
    a dot provided in the separation space to transfer the external force to the piezoelectric element or to transfer a vibration of the piezoelectric element to the cover.

2. The button device of claim 1, further comprising an adhesive between the plate and the second spacer and an adhesive between the second spacer and the cover.

3. The button device of claim 1, wherein the second spacer is a double-sided adhesive tape.

4. The button device of claim 1, wherein the separation space is empty.

5. The button device of claim 1, wherein the separation space is filled with a soft material.

6. The button device of claim 1, wherein the second spacer is formed along the edge portion.

7. The button device of claim 1, wherein a plurality of such second spacers are formed at a plurality of places of the edge portion while being spaced apart.

8. The button device of claim 1, wherein the piezoelectric body is a stack type piezoelectric body.

9. The button device of claim 1, wherein a ratio of a length of the piezoelectric body to a length of the plate is 55% or more.

* * * * *